United States Patent Office 3,741,881
Patented June 26, 1973

3,741,881

SURFACE TREATMENT OF POLYURETHANE FOR PLATING

Ismat A. Abu-Isa, Birmingham, and Roger J. Eldred, Detroit, Mich., assignors to General Motors Corporation, Detroit, Mich.

No Drawing. Filed Sept. 15, 1971, Ser. No. 180,903
Int. Cl. C23b 5/64
U.S. Cl. 204—30 3 Claims

ABSTRACT OF THE DISCLOSURE

The surface of a polyurethane elastomer is rendered electroplatable by first treating it with one of certain specific ultraviolet radiation sensitizers, then exposing it to intense ultraviolet radiation and subsequently subjecting it to a known electroless plating procedure. The resulting surface may then be electrolytically plated with copper, nickel, silver or other desired metal.

This invention relates to electroplating polyurethane surfaces. More specifically, this invention pertains to a preliminary treatment by which a surface of a polyurethane article is rendered receptive to the formation of an adherent, conductive metal layer by standard electroless plating processes and the subsequent electrolytic plating of a desired metal(s) on the conductive layer.

Some synthetic polymeric resins can be electroplated to provide a bright metal finish. Generally this involves etching the resin surface, such as with acid-chromate oxidants, and subsequently providing a conductive metal layer on the surface by electroless plating techniques. Typically, electroless plating techniques comprise sensitizing the resin surface with a suitable of stannous ions whereby the stannous ions are adsorbed on the resin surface. The sensitized surface is then activated in a noble metal salt bath, such as a bath of palladium chloride. Following this the surface is then treated with an electroless copper or electroless nickel solution. Copper or nickel ions are reduced on the resin surface to the elemental metal to form a thin but strongly adherent conductive layer. Following all of this, metals such as copper, nickel, chromium and/or silver are electroplated onto the adherent, conductive surface by conventional electrolytic plating techniques.

No such techniques are directly applicable to the plating of polyurethane resins. Up until the present invention it has been found that an electroless copper or nickel layer is not adherent to the polyurethane surface. Any later-formed electroplated layer is spotty with no substantial adhesion between the metal and the polymer.

Accordingly, it is an object of the present invention to provide a method of pretreating a surface of a polyurethane resin so that subsequent electroless plating and electrolytic plating processing are effective to produce a strong metal plate thereon.

It is a more specific object of the present invention to provide an effective pretreatment method for electroplating polyurethanes which involves treating a surface of a polyurethane resin with a material which sensitizes the surface to ultraviolet (UV) radiation and subsequently exposing the surface to intense UV radiation. As a result, the surface is rendered receptive to conventional electroless plating and subsequent electrolytic plating so that an adherent metal plate is obtained.

In accordance with a preferred embodiment of our invention, these and other objects and advantages are accomplished in a preferred embodiment thereof by first fully coating the polyurethane surface to be plated with a material selected from the group consisting of 1,3-diphenyl-2-propanone, tert-butyl peroctoate and methyl ethyl ketone peroxides. The coating is performed either by direct application of the material onto the surface, or by dipping the part into a solution of the sensitizers. The coated surface is then subjected to intense UV radiation having a wavelength within the range of about 1,500 to 3,500 angstroms. It is preferred that the intensity of the UV radiation be at least about 2,500 microwatts per square centimeter at the surface of the elastomer. The treated elastomeric surface, without cleaning, is immersed in a solution of stannous chloride for a sufficient time (generally about five minutes) for the elastomeric surface to become water wettable. The elastomer is then placed in palladium chloride solution for a few minutes and subsequently immersed in a conventional electroless nickel solution or electroless copper solution for five to ten minutes. At this point the part has a thin, conductive, adherent metal coating which provides the basis for electrolytic metal plating as desired.

These and other objects and advantages of our invention will become more apparent from a detailed description thereof which follows.

A specific example of an embodiment of our process will illustrate the practice of the invention. A portion of a microcellular foam polyurethane bumper body, such as described in U.S. Pat. No. 3,493,257, assigned to the assignee of the subject invention, was taken for plating. The microcellular urethane elastomeric foam was formed by reaction of the following materials: 100 parts by weight of polyoxypropylene diol having a molecular weight of about 1,000, 26.7 parts by weight of 4,4'-methylene-bis (2-chloroaniline), 2 parts by weight silicone glycol surfactant, 0.5 part by weight carbon black, 0.05 part by weight distilled water, 36.5 parts by weight toluene diisocyanate (80%, 2,4-toluene diisocyanate and 20%, 2,6-toluene diisocyanate), and 0.3 part by weight stannous octoate. The material was cured in a mold cavity for ten minutes at about 250° F.

In this example no polyurethane surface coating film was provided on the microcellular foam body as was formed on the bumper structure described in the above-identified patent. All of the surface to be plated was coated with a thin layer of Lucidol Delta X methyl ethyl ketone peroxides. This material is a mixture of peroxides of methyl ethyl ketone. The mixture is supplied as 60% by weight $C_8H_{16}O_4$ in dimethyl phthalate. It contained 11% by weight active oxygen. The peroxide-coated surface was allowed to stand for about five minutes and then subjected to the radiation of a Hanovia mercury vapor lamp, Model No. 30–600, for about thirty minutes. The lamp was placed at a distance of six inches from the elastomer surface. The intensity of the total UV radiation was about 2,500 microwatts per square centimeter at the elastomer surface.

The coated and UV treated surface was then immersed for five minutes at room temperature in a stannous chloride and hydrochloric acid solution containing 35 grams stannous chloride and 30 milliliters hydrochloric acid per liter of solution. The sensitized surface was then rinsed to remove excess stannous ions from the surface of the elastomer to prevent contamination of the activator bath. The part was then immersed at room temperature in an activator bath comprising an aqueous solution of palladium chloride (0.26 gram per liter of solution) and hydrochloric acid (4.5 milliliters per liter of solution). The part was rinsed to remove the last traces of the activating solution and then immersed in an aqueous electroless nickel plating bath for eight minutes at 80° C. The aqueous electroless nickel bath contained 36 grams per liter $NiSO_4 \cdot 6H_2O$, 3.6 grams per liter NaOH, 28 grams per liter sodium hypophosphite, 13 milliliters per liter acetic acid and 3 drops per liter of a lead concentrate containing one gram per liter of $Pb^{++}$. A uniform, well adhering, electrically conductive nickel layer approximately ten microns in thickness was deposited on the polyurethane surface.

A layer of copper, two mils in thickness, was electrolytically deposited on the electroless nickel layer. The copper deposit was made from an aqueous electrolyte solution containing 240 grams per liter $CuSO_4$ and 32.6 milliliters per liter $H_2SO_4$. In conventional electroplating procedures additional layers of nickel and chrome would probably be applied to provide an attractive surface. However, in this experiment further plating was stopped at this point so that the adherence of the existing plate could be evaluated. The sample was aged for one week at ambient conditions. Grooves were then cut through the metal plate down to the polymer surface in accordance with the Jacquet test (see Plating, vol. 52, p. 982 (1965)). A strip of the plate was lifted up so that it could be held in the grip of an Instron machine. The plated layer was pulled and peeled at an angle of 90° to the polymer surface by the Instron machine at a crosshead speed of one inch per minute. The force necessary to remove the metal plate layer was found to be 5.2 pounds per inch of width of strip removed.

When the same bumper part was coated by the same electroless-electrolytic processes without first being pretreated by our process, a spotty coating having an adhesion of only 1.5 pounds per inch of width of strip removed was obtained.

Chrome plated polyurethane bumper parts have been formed in accordance with our process. The bumper specimens were treated exactly as set forth above through the UV treatment process and the application of a layer of electroless nickel approximately ten microns in thickness. The bumper specimens were then immersed in a bright acid copper bath, such as that supplied by the Udylite Corporation under the trade designation "UBAC." The bath formulation contained about 30 ounces per gallon $CuSO_4 \cdot 5H_2O$, 4.1 fluid ounces per gallon $H_2SO_4$, 0.2 to 0.8 milliliter per gallon HCl and about 0.5% by volume brighteners. Electroplating in this bath was carried out for fifteen minutes at 25 to 30 amperes to obtain a deposit of about 0.7 mil of copper.

The copper-plated bumper specimens were then immersed in a semibright nickel bath (Udylite N2E). This aqueous bath comprised 40 to 55 ounces per gallon $NiSO_4 \cdot 6H_2O$, 4.0 to 5.0 ounces per gallon $NiCl_2 \cdot 3\frac{1}{2}H_2O$, 6.0 ounces per gallon boric acid and 12 to 24 fluid ounces per gallon brighteners. A 0.5 mil electrolytic deposit of semibright nickel was obtained.

A 0.3 mil layer of bright nickel was then electrolytically formed on the semibright nickel layer. A Udylite 66 bath was employed containing 46.5 ounces per gallon $NiSO_4 \cdot 6H_2O$, 8.26 ounces per gallon $NiCl_2 \cdot 3\frac{1}{2}H_2O$, 6.2 ounces per gallon boric acid, 0.17 ounce per gallon $NaBF_4$ and 76.4 milliliters per gallon of brighteners.

Finally, a hard chrome layer 0.01 mil in thickness was electrolytically deposited from an aqueous electrolyte bath comprising 34.4 ounces per gallon $CrO_3$ and 5.56 milliliters per gallon $H_2SO_4$. The resulting plated layer was uniform, tightly adherent to the polymer substrate and attractive, unlike the spotty, readily peelable layers previously formed.

Only two other UV radiation sensitizers are considered suitable for use in the practice of our invention. Tert-butyl peroctoate suitably sensitizes the polyurethane surface for UV treatment and subsequent electroless plating operations. No solvent need be employed in applying tert-butyl peroctoate to the elastomer surface. The other UV sensitizer which is suitable for use in our process is 1,3-diphenyl-2-propanone. Preferably, a solvent is used to distribute this material over the elastomer surface. A 50/50 mixture of acetone and water is suitable for this purpose.

Besides successfully treating the polyether polyoltoluene diisocyanate polyurethane composition described above, our process is also applicable to polyester polyol-diisocyanate polyurethane compositions, such as the urethane which is the reaction product of a polyester polyol formed from adipic acid and a glycol, with butane-1,4-diisocyanate. A polyurethane composition of this type was employed as a surface coating layer on the microcellular bumper dsecribed in the above-identified patent. Our process is considered of general application to polyurethane polymers.

Preferably the treatment with the UV sensitizer is for a duration of about one to five minutes at room temperature. No solvents should be used in connection with the application of the sensitizer which dissolves or otherwise degrades the polyurethane surface. Apart from the UV sensitizers listed above we are aware of no other materials which may successfully be used in combination with UV radiation to successfully pretreat urethane surfaces in accordance with our process. Other peroxides, such as benzoyl peroxide, dicumyl peroxide and hydrogen peroxide, were found to be unsuitable for this purpose.

Exposure to intense UV radiation is for a period of about fifteen to sixty minutes. Typically about thirty minutes is preferable.

Following the treatment with the UV sensitizer and the high intensity UV radiation, the electroless plating process is conducted in accordance with standard procedure. First, a sensitizing step consisting of immersing the UV treated polyurethane surface in a solution of stannous chloride in hydrochloric acid is undertaken. In addition to stannous chloride other stannous salts, such as stannous fluoborate and stannous sulfate, are suitable for use in the sensitizing bath. Typically about ten to forty grams stannous salt and up to about forty milliliters HCl per liter of aqueous bath are employed. The excess stannous salts are washed off before immersion in the activator bath.

The activator bath comprises an aqueous solution of palladium chloride in hydrochloric acid. Generally, about 0.2 to 0.3 gram per liter palladium chloride and about 2 to 5 milliliters of hydrochloric acid per liter of aqueous solution are employed. After immersion for three to five minutes in the activator bath, the part is rinsed and then immersed in a conventional electroless nickel or electroless copper bath to provide the adherent conductive coating. Electrolytic plating is then carried out in accordance with standard procedures and itself forms no basis for the present pretreatment invention.

While our invention has been described in terms of a few specific preferred embodiments thereof, it will be appreciated that other forms could readily be adapted by one skilled in the art. Accordingly, the scope of our invention is to be considered limited only by the following claims.

What is claimed is:

1. A method of preparing a polyurethane resin surface for the electrolytic deposition of a surface coating layer comprising coating the surface of the polyurethane resin to be plated with a material taken from the group consisting of 1,3-diphenyl-2-propanone, tert-butyl peroctoate and methyl ethyl ketone peroxides, subjecting the coated polyurethane surface to intense ultraviolet radiation for a period up to about one hour, the intensity of said ultraviolet radiation being at least about 2,500 microwatts per square centimeter, applying an electrically conductive coating of a metal taken from the group consisting of copper and nickel on said surface by electroless deposition, and subsequently electrolytically depositing a desired metal on said polyurethane surface.

2. A method of preparing a surface of polyurethane resin for electroplating comprising treating the surface of the polyurethane article to be plated with a material taken from the group consisting of 1,3-diphenyl-2-propanone, tert-butyl peroctoate and methyl ethyl ketone peroxides, subjecting the treated surface to ultraviolet radiation having an intensity of at least about 2,500 microwatts per square centimeter for a period of about fifteen to sixty minutes, sensitizing the surface by immersion in an aqueous bath of stannous ions, activating said surface by immersion in an aqueous bath of palladium ions, and subsequently rendering said surface electrically conductive by depositing an adherent layer of metal taken from the group consisting of copper and nickel on said surface from an electroless deposition solution of said metal.

3. A method of preparing a surface of polyurehtane resin for electroplating comprising treating the surface of the polyurethane article to be plated with a material taken from the group consisting of 1,3-diphenyl-2-propanone, tert-butyl peroctoate and methyl ethyl ketone peroxides and allowing the coated polyurethane article to stand for at least one to five minutes at room temperature, subjecting the treated surface to ultraviolet radiation having an intensity of at least about 2,500 microwatts per square centimeter for a period of at least fifteen to sixty minutes, sensitizing the surface by immersion in an aqueous bath of stannous ions, activating said surface by immersion in an aqueous bath of palladium ions, and subsequently rendering said surface electrically conductive by depositing an adherent layer of metal taken from the group consisting of copper and nickel on said surface from an electroless deposition solution of said metal.

References Cited

UNITED STATES PATENTS

| | | | |
|---|---|---|---|
| 3,616,296 | 10/1971 | Bernhardt et al. | 204—30 |
| 3,619,246 | 11/1971 | Bragole | 117—47 A |
| 3,484,270 | 12/1969 | Saubestre et al. | 117—47 A |
| 3,370,974 | 2/1968 | Hepfer | 117—47 A |

JOHN H. MACK, Primary Examiner

W. I. SOLOMON, Assistant Examiner

U.S. Cl. X.R.

117—47 A, 138.8 D